(12) United States Patent
Todorow et al.

(10) Patent No.: US 10,573,493 B2
(45) Date of Patent: Feb. 25, 2020

(54) INDUCTIVELY COUPLED PLASMA APPARATUS

(71) Applicant: APPLIED MATERIALS, INC., Santa Clara, CA (US)

(72) Inventors: Valentin N. Todorow, Palo Alto, CA (US); Samer Banna, San Jose, CA (US); Ankur Agarwal, Mountain View, CA (US); Zhigang Chen, Campbell, CA (US); Tse-Chiang Wang, Concord, CA (US); Andrew Nguyen, San Jose, CA (US); Martin Jeff Salinas, San Jose, CA (US); Shahid Rauf, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 728 days.

(21) Appl. No.: 15/070,847

(22) Filed: Mar. 15, 2016

(65) Prior Publication Data
US 2016/0196953 A1 Jul. 7, 2016

Related U.S. Application Data

(62) Division of application No. 13/751,229, filed on Jan. 28, 2013, now abandoned, which is a division of
(Continued)

(51) Int. Cl.
*C23C 16/00* (2006.01)
*H01L 21/326* (2006.01)
(Continued)

(52) U.S. Cl.
CPC ............ *H01J 37/321* (2013.01); *B44C 1/227* (2013.01); *C23C 16/505* (2013.01); *H01J 37/3244* (2013.01)

(58) Field of Classification Search
CPC ................. H01J 37/321; H01J 37/3211; H01J 37/32119; H01J 37/32128;
(Continued)

(56) References Cited

U.S. PATENT DOCUMENTS 5,540,824 A 7/1996 Yin et al.
5,571,366 A 11/1996 Ishii et al.
(Continued)

FOREIGN PATENT DOCUMENTS

CN 1871685 A 11/2006
EP 0694949 A2 1/1996
(Continued)

*Primary Examiner* — Luz L Alejandro Mulero
(74) *Attorney, Agent, or Firm* — Moser Taboada; Alan Taboada (57) ABSTRACT

Methods and apparatus for plasma processing are provided herein. In some embodiments, a plasma processing apparatus includes a process chamber having an interior processing volume; a first RF coil disposed proximate the process chamber to couple RF energy into the processing volume; and a second RF coil disposed proximate the process chamber to couple RF energy into the processing volume, the second RF coil disposed coaxially with respect to the first RF coil, wherein the first and second RF coils are configured such that RF current flowing through the first RF coil is out of phase with RF current flowing through the RF second coil.

12 Claims, 5 Drawing Sheets

Related U.S. Application Data application No. 12/821,609, filed on Jun. 23, 2010, now abandoned.

(60) Provisional application No. 61/254,833, filed on Oct. 26, 2009.

(51) Int. Cl.
    *H01J 37/32* (2006.01)
    *B44C 1/22* (2006.01)
    *C23C 16/505* (2006.01)

(58) Field of Classification Search
    CPC ........... H01J 37/32137; H01J 37/32146; H01J 37/32155; H01J 37/32165; H01J 37/32174; H01J 37/32183
    USPC ........ 156/345.48, 345.49; 118/723 I, 723 IR, 118/723 AN; 315/111.51
    See application file for complete search history.

(56) References Cited

U.S. PATENT DOCUMENTS

| | | | |
|---|---|---|---|
| 5,637,961 A * | 6/1997 | Ishii | H01J 37/32082 315/111.21 |
| 6,414,648 B1 * | 7/2002 | Holland | H01J 37/321 118/723 I |
| 6,451,161 B1 | 9/2002 | Jeng et al. | |
| 6,685,798 B1 | 2/2004 | Holland et al. | |
| 6,744,213 B2 * | 6/2004 | Wilcoxson | H01J 37/321 315/111.21 |
| 7,019,253 B2 | 3/2006 | Johnson et al. | |
| 7,273,533 B2 | 9/2007 | Brcka et al. | |
| 8,229,391 B2 | 7/2012 | Liang et al. | |
| 2002/0100557 A1 | 8/2002 | Li et al. | |
| 2004/0026040 A1 * | 2/2004 | Kurihara | H01J 37/32192 156/345.48 |
| 2004/0255864 A1 | 12/2004 | Jeon et al. | |
| 2008/0050292 A1 | 2/2008 | Godyak | |
| 2009/0284156 A1 | 11/2009 | Banna et al. | |
| 2010/0025384 A1 | 2/2010 | Todorow et al. | |
| 2011/0094683 A1 | 4/2011 | Chen et al. | |
| 2011/0097901 A1 | 4/2011 | Banna et al. | |

FOREIGN PATENT DOCUMENTS

| | | | |
|---|---|---|---|
| EP | 0 756 306 A1 | | 1/1997 |
| JP | 08-078191 | * | 3/1996 |
| JP | 2000-235900 A | | 8/2000 |
| JP | 2000-239938 A | | 9/2000 |
| JP | 2003-224112 | | 8/2003 |
| JP | 2006-518915 A | | 8/2006 |
| JP | 2006-318725 | | 11/2006 |
| JP | 2007-311182 | * | 11/2007 |
| KR | 10-2009-0013626 | | 2/2009 |
| TW | 491001 | | 6/2002 |
| TW | 2008-18996 A | | 4/2008 |
| WO | WO 03/017738 A1 | | 2/2003 |
| WO | WO 2008/027308 A2 | | 3/2008 |

* cited by examiner

INDUCTIVELY COUPLED PLASMA APPARATUS

CROSS-REFERENCE TO RELATED APPLICATIONS

This application is a divisional of U.S. patent application Ser. No. 13/751,229, filed Jan. 28, 2013, which is a divisional of U.S. patent application Ser. No. 12/821,609, filed Jun. 23, 2010, which claims benefit of U.S. provisional patent application Ser. No. 61/254,833, filed Oct. 26, 2009. Each of the aforementioned related patent applications is herein incorporated by reference.

FIELD

Embodiments of the present invention generally relate to plasma processing equipment.

BACKGROUND

Inductively coupled plasma (ICP) process reactors generally form plasmas by inducing current in a process gas disposed within the process chamber via one or more inductive coils disposed outside of the process chamber. The inductive coils may be disposed externally and separated electrically from the chamber by, for example, a dielectric lid. When radio frequency (RF) current is fed to the inductive coils via an RF feed structure from an RF power supply, an inductively coupled plasma can be formed inside the chamber from an electric field generated by the inductive coils.

In some reactor designs, the reactor may be configured to have concentric inner and outer inductive coils. The inventors have discovered that additive electric field properties (due to destructive interference of the magnetic fields induced by the coils) between the inner and outer coils can result in non-uniformities in the electric field distribution of the plasma formed at the substrate level away from the coils. For example, due to etch rate non-uniformities caused by the non-uniform electric field distribution in the plasma, a substrate etched by such a plasma may result in a non-uniform etch pattern on the substrate, such as an M-shaped etch pattern, e.g., a center low and edge low etch surface with peaks between the center and edge. The inventor's have further observed that adjusting the power ratio between the inner and outer coils to control the severity of the non-uniformity is not sufficient to completely eliminate the non-uniformity. Moreover, in order to meet the critical dimension requirements of advanced device nodes, e.g., about 32 nm and below, the remaining etch pattern non-uniformities due to this phenomenon may need to be further reduced or eliminated.

Accordingly, the inventors have devised a plasma process apparatus to better control plasma processing non-uniformity.

SUMMARY

Methods and apparatus for plasma processing are provided herein. In some embodiments, a plasma processing apparatus includes a process chamber having an interior processing volume; a first RF coil disposed proximate the process chamber to couple RF energy into the processing volume; and a second RF coil disposed proximate the process chamber to couple RF energy into the processing volume, the second RF coil disposed coaxially with respect to the first RF coil, wherein the first and second RF coils are configured such that RF current flowing through the first RF coil is out of phase with RF current flowing through the second RF coil.

In some embodiments, a plasma processing apparatus includes a process chamber having an interior processing volume; a first RF coil disposed proximate the process chamber to couple RF energy into the processing volume and wound in a first direction; and a second RF coil disposed proximate the process chamber to couple RF energy into the processing volume, the second RF coil disposed coaxially with respect to the first RF coil and wound in a second direction opposite the first direction such that RF current flows through the first RF coil in the first direction and through the second RF coil in the second direction.

In some embodiments, a method of forming a plasma includes providing an RF signal through a first RF coil; providing the RF signal through a second RF coil coaxially disposed with respect to the first RF coil such that the RF signal flows through the second coil out of phase with respect to the flow of the RF signal through the first coil; and forming a plasma by coupling the RF signal provided by the first and second RF coils to a process gas disposed in a process chamber. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for plasma processing are provided herein. The inventive methods and plasma processing apparatus advantageously provide a more uniform plasma as compared to conventional apparatus, thus providing a more uniform processing result on a substrate being processed with the plasma. For example, a plasma formed utilizing the inventive plasma apparatus has an improved electric field distribution, which provides a more uniform plasma and can be utilized to produce a more uniform process, such as an etch pattern on a surface of a substrate.

Figure 1:
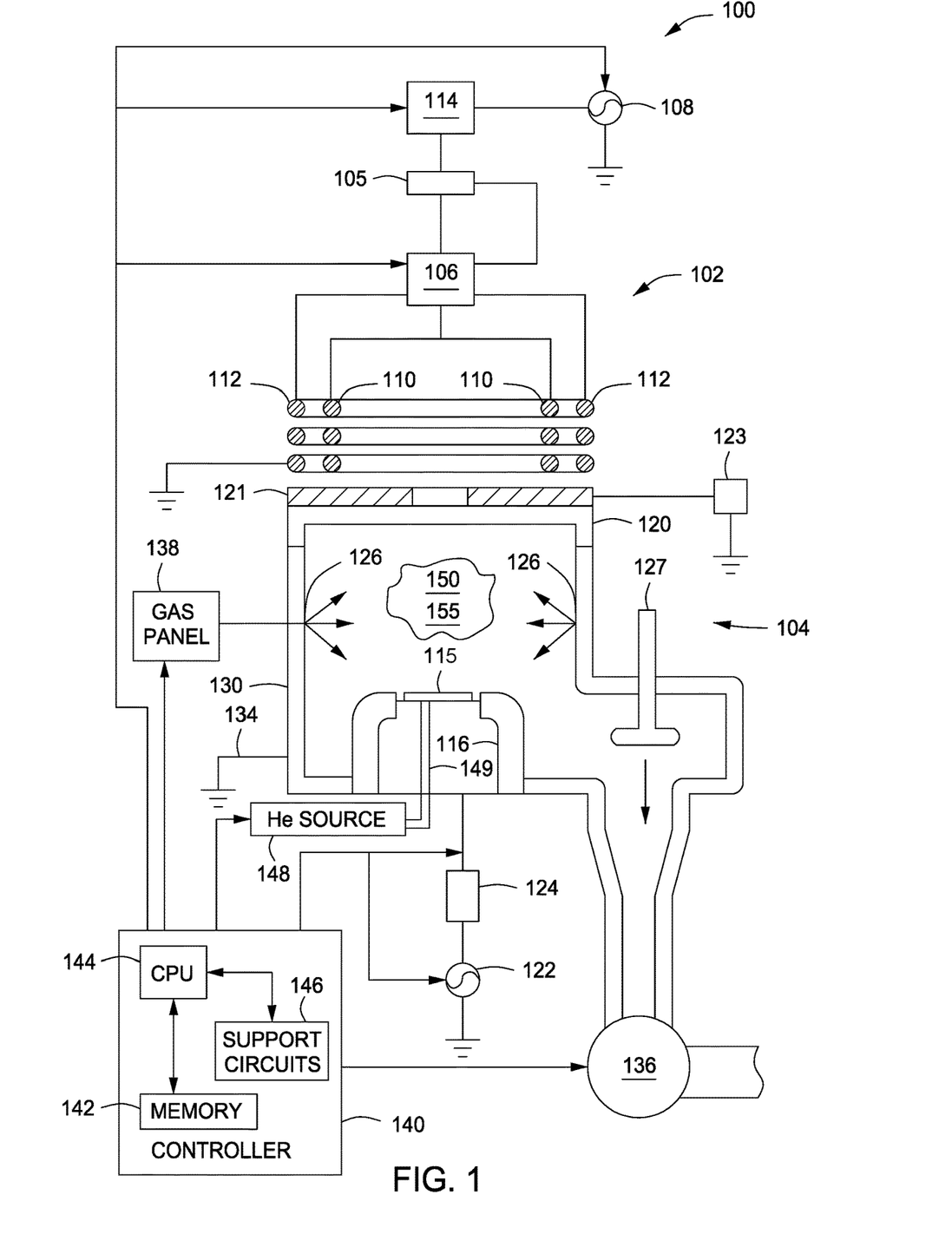
FIG. 1 depicts a schematic side view of an inductively coupled plasma reactor in accordance with some embodiments of the present invention.

FIG. 1 depicts a schematic side view of an inductively coupled plasma reactor (reactor 100) in accordance with some embodiments of the present invention. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment (such as the DPS®, DPS® II, DPS® AE, DPS® G3 poly etcher, DPS® G5, or the like) also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings.

The reactor 100 includes an inductively coupled plasma apparatus 102 disposed atop a process chamber 104. The inductively coupled plasma apparatus includes an RF feed structure 106 for coupling an RF power supply 108 to a plurality of RF coils, e.g., a first RF coil 110 and a second RF coil 112. The plurality of RF coils are coaxially disposed proximate the process chamber 104 (for example, above the process chamber) and are configured to inductively couple RF power into the process chamber 104 to form a plasma from process gases provided within the process chamber 104.

Figure 4A:
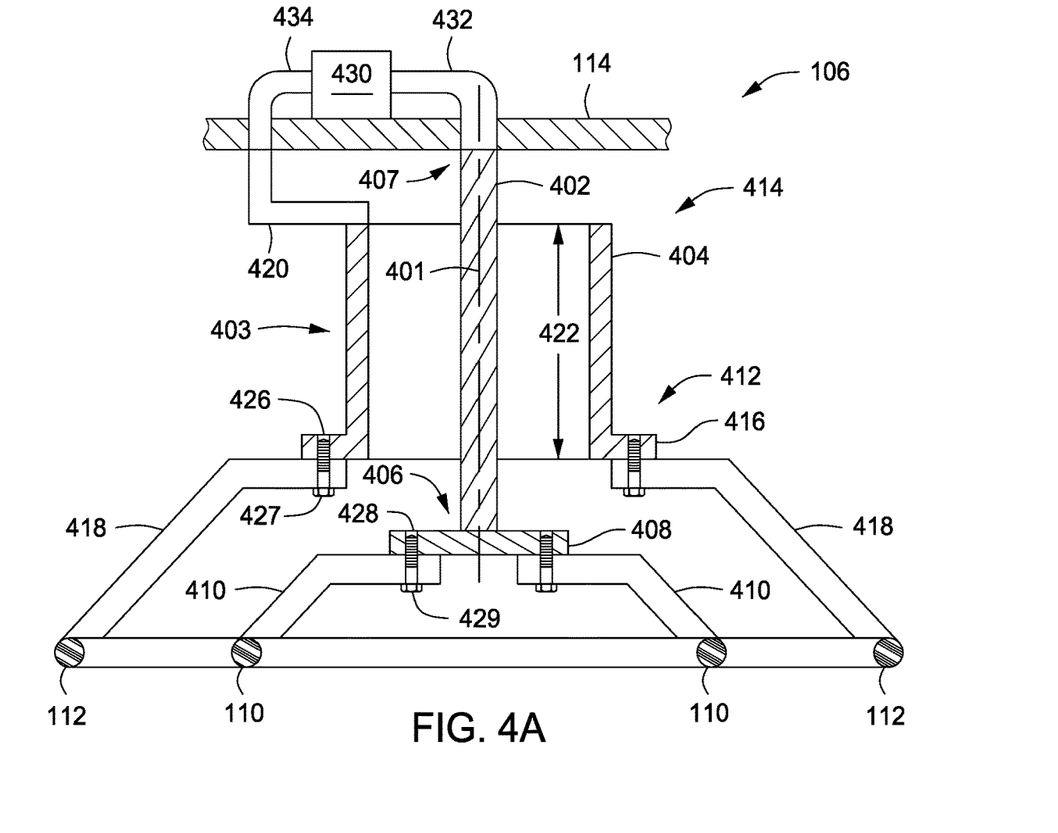
FIGS. 4A-B depict an RF feed structure in accordance with some embodiments of the present invention.

The RF power supply 108 is coupled to the RF feed structure 106 via a match network 114. A power divider 105 may be provided to adjust the RF power respectively delivered to the first and second RF coils 110, 112. The power divider 105 may be coupled between the match network 114 and the RF feed structure 106. Alternatively, the power divider may be a part of the match network 114, in which case the match network will have two outputs coupled to the RF feed structure 106—one corresponding to each RF coil 110, 112. The power divider is discussed in more detail below in accordance with the embodiments illustrated in FIG. 4.

The RF feed structure 106 couples the RF current from the power divider 116 (or the match network 114 where the power divider is incorporated therein) to the respective RF coils. In some embodiments, the RF feed structure 106 may be configured to provide the RF current to the RF coils in a symmetric manner, such that the RF current is coupled to each coil in a geometrically symmetric configuration with respect to a central axis of the RF coils, such as by a coaxial structure.

The reactor 100 generally includes the process chamber 104 having a conductive body (wall) 130 and a dielectric lid 120 (that together define a processing volume), a substrate support pedestal 116 disposed within the processing volume, the inductively coupled plasma apparatus 102, and a controller 140. The wall 130 is typically coupled to an electrical ground 134. In some embodiments, the support pedestal 116 may provide a cathode coupled through a matching network 124 to a biasing power source 122. The biasing source 122 may illustratively be a source of up to 1000 W at a frequency of approximately 13.56 MHz that is capable of producing either continuous or pulsed power, although other frequencies and powers may be provided as desired for particular applications. In other embodiments, the source 122 may be a DC or pulsed DC source.

In some embodiments, a link (not shown) may be provided to couple the RF power supply 108 and the biasing source 122 to facilitate synchronizing the operation of one source to the other. Either RF source may be the lead, or master, RF generator, while the other generator follows, or is the slave. The link may further facilitate operating the RF power supply 108 and the biasing source 122 in perfect synchronization, or in a desired offset, or phase difference. The phase control may be provided by circuitry disposed within either or both of the RF source or within the link between the RF sources. This phase control between the source and bias RF generators (e.g., 108, 122) may be provided and controlled independent of the phase control over the RF current flowing in the plurality of RF coils coupled to the RF power supply 108. Further details regarding phase control between the source and bias RF generators may be found in commonly owned, U.S. patent application Ser. No. 12/465,319, filed May 13, 2009 by S. Banna, et al., and entitled, "METHOD AND APPARATUS FOR PULSED PLASMA PROCESSING USING A TIME RESOLVED TUNING SCHEME FOR RF POWER DELIVERY," which is hereby incorporated by reference in its entirety.

In some embodiments, the dielectric lid 120 may be substantially flat. Other modifications of the chamber 104 may have other types of lids such as, for example, a dome-shaped lid or other shapes. The inductively coupled plasma apparatus 102 is typically disposed above the lid 120 and is configured to inductively couple RF power into the process chamber 104. The inductively coupled plasma apparatus 102 includes the first and second coils 110, 112, disposed above the dielectric lid 120. The relative position, ratio of diameters of each coil, and/or the number of turns in each coil can each be adjusted as desired to control, for example, the profile or density of the plasma being formed via controlling the inductance on each coil. Each of the first and second coils 110, 112 is coupled through the matching network 114 via the RF feed structure 106, to the RF power supply 108. The RF power supply 108 may illustratively be capable of producing up to 4000 W at a tunable frequency in a range from 50 kHz to 13.56 MHz, although other frequencies and powers may be provided as desired for particular applications.

The first and second RF coils 110, 112 can be configured such that the phase of the RF current flowing through the first RF coil can be out of phase with respect to the phase of the RF current flowing through the RF second RF coil. As used herein, the term "out of phase" can be understood to mean that the RF current flowing through the first RF coil is flowing in an opposite direction to the RF current flowing through the second RF coil, or that the phase of the RF current flowing through the first RF coil is shifted with respect to the RF current flowing through the second RF coil.

For example, in conventional apparatus, both RF coils are typically wound in the same direction. As such, the RF current is flowing in the same direction in both coils, either clockwise or counterclockwise. The same direction of the winding dictates that the RF current flowing in the two RF coils are always in phase. In the present invention, the inventors have examined providing RF current out of phase between the two coils by either external means or by physically winding one of the coils in the opposite direction, thus altering the original phase. By controlling the phase between the coils the inventors have discovered the ability to reduce and eliminate non-uniform etch results, such as the M-shape etch pattern, and furthermore to control the processing (such as etch rate) pattern from center high, to edge high or to a flat and uniform processing pattern. By providing out of phase RF current between the coils and by controlling the current ratio between the inner and outer coil the inventors have provided an apparatus that facilitates control over the processing pattern to achieve improved uniformity across the substrate.

By providing out of phase RF current between the coils, the apparatus reverses the destructive interference between the electromagnetic fields generated by each coil to be constructive, and, therefore, the typical constructive electric field plasma properties within the reactor may be similarly reversed. For example, the present apparatus may be configured to increase the electric field proximate each of the first and second coils and decrease the electric field between the coils by providing out of phase RF current flowing along the first and second coils. In some embodiments, such as where the RF current in each of the coils is completely out of phase (e.g., reverse current flow or 180 phase difference) the electric fields may be maximized (or localized) proximate each of the first and second coils and minimized (or null) between the coils due to destructive interference between opposing electric fields. The inventors have discovered that a plasma formed using such a coil configuration can advantageously have an improved, e.g., a more uniform, electric field distribution and that components of the plasma may diffuse into the null region of the electric field to provide a more uniform plasma.

Figure 2:
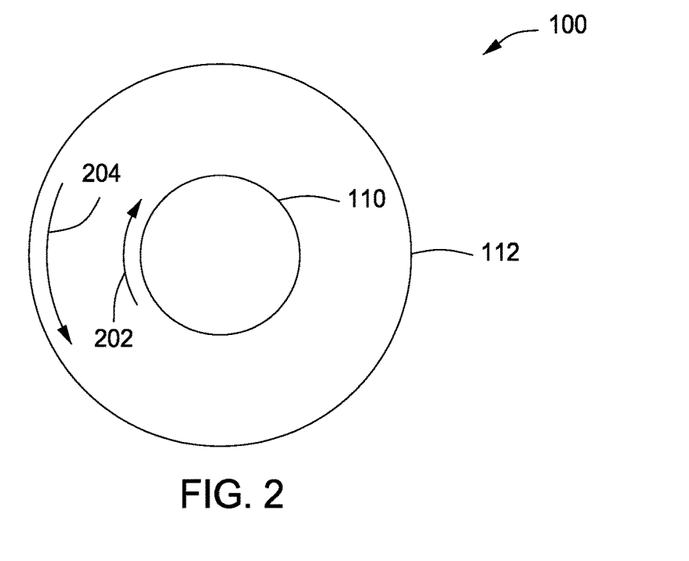
FIG. 2 depicts a schematic top view of a pair of RF coils of an inductively coupled plasma reactor in accordance with some embodiments of the present invention.

In some embodiments, the direction of the RF current flowing through each coil can be controlled by the direction in which the coils are wound. For example, as illustrated in FIG. 2, the first RF coil 110 can be wound in a first direction 202 and the second RF coil 112 can be wound in a second direction 204 which is opposite the first direction 202. Accordingly, although the phase of the RF signal provided by the RF power supply 108 is unaltered, the opposing winding directions 202, 204 of the first and second RF coils 110, 112 cause the RF current to be out of phase, e.g., to flow in opposite directions.

In some embodiments, a power divider, such as a dividing capacitor, may be provided between the RF feed structure 106 to control the relative quantity of RF power provided by the RF power supply 108 to the respective first and second coils. For example, as shown in FIG. 1, a power divider 105 may be disposed in the line coupling the RF feed structure 106 to the RF power supply 108 for controlling the amount of RF power provided to each coil (thereby facilitating control of plasma characteristics in zones corresponding to the first and second coils). In some embodiments, the power divider 105 may be incorporated into the match network 114. In some embodiments, after the power divider 105, RF current flows to flows to the RF feed structure 106 where it is distributed to the first and second RF coils 110, 112. Alternatively, the split RF current may be fed directly to each of the respective first and second RF coils.

Figure 3A:
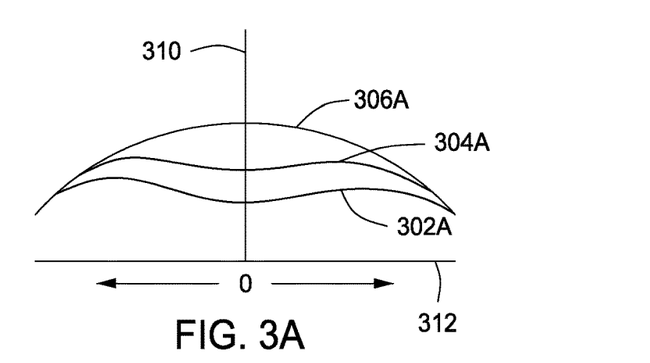
FIGS. 3A-B illustratively depict graphs of etch rate profiles generated using conventional apparatus and an embodiment of the inventive apparatus as disclosed herein.
Figure 3B:
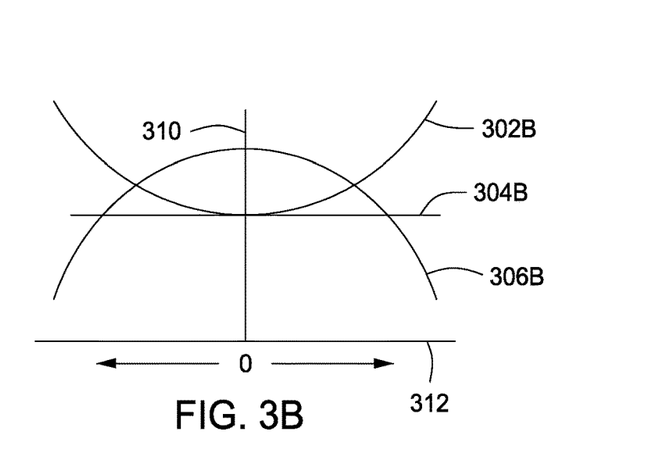

By adjusting the power ratio in combination with the phase of the RF signal flowing through each of the first and second coils, the inventors have discovered that undesired processing non-uniformities (such as the M-shape etch profile of a substrate surface) may be controlled. For example, FIGS. 3A-B illustratively depict graphs of etch rate profiles generated using conventional apparatus and an embodiment of the inventive apparatus as disclosed herein. These graphs illustratively depict data from actual tests and observations performed by the inventors. FIG. 3A depicts an etch rate profile graph of the etch rate (axis 310) radially along a substrate surface (axis 312) for a plurality of power ratios between the first and second coils in a conventional apparatus (plots 302A, 304A and 306A). While some control over the etch rate profile can be achieved by adjusting the power ratio in the conventional apparatus, as shown in FIG. 3A, the inventors have discovered that any adjustment of the power ratio still results in inadequate overall uniformity, and in particular, poor edge profile tenability (e.g., each power ratio provides a limited effect at the edge of the etch profile).

In contrast, FIG. 3B depicts an etch rate profile graph of the etch rate (axis 310) radially along a substrate surface (axis 312) for a plurality of the same power ratios between the first and second coils in an apparatus in accordance with embodiments of the present invention having the RF current flowing through the first and second RF coils 180 degrees out of phase (plots 302B, 304B and 306B). Specifically, by making the same power ratio adjustments in the inventive apparatus as shown in FIG. 3B, the inventors have discovered that a significantly greater degree of uniformity control can be achieved. In addition, greatly improved edge profile tunability can be also achieved. As can be seen from the graph in FIG. 3B, the inventive apparatus can provide a substantially uniform etch rate profile by tuning the power ratio (e.g., 304B) and can also provide a significantly greater edge profile tunability as compared to a conventional apparatus. For example, by controlling the power ratio in a chamber configured to have RF current flowing through the two RF coils out of phase, the uniformity profile can be controlled to provide center high and edge low etch rates, substantially flat etch rates, or center low and edge high etch rates. As these results are due to the plasma uniformity, such control is also transferrable to other processes or results (such as plasma treatment, deposition, annealing, or the like) where plasma uniformity provides control over such processes or results.

Figure 4B:
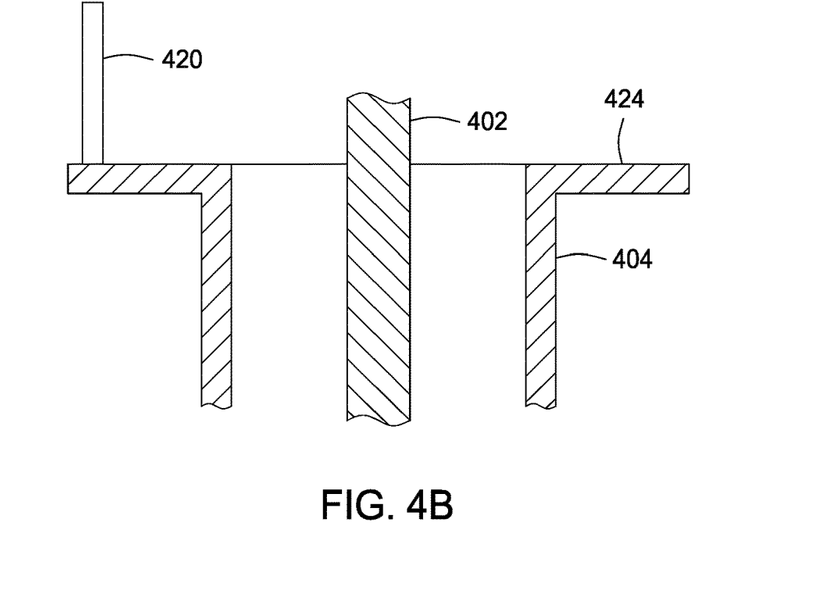

Embodiments of an exemplary RF feed structure 106 that may be utilized in combination with the out of phase RF coil apparatus disclosed herein are described below and depicted in further detail in FIGS. 4A-B. Further details regarding the exemplary RF feed structure may be found in U.S. Patent Application Ser. No. 61/254,838, filed on Oct. 26, 2009, by Z. Chen, et al., and entitled "RF FEED STRUCTURE FOR PLASMA PROCESSING," which is hereby incorporated by reference in its entirety. For example, FIGS. 4A-B depicts the RF feed structure 106 in accordance with some embodiments of the present invention. As depicted in FIG. 4A, the RF feed structure 106 may include a first RF feed 402 and a second RF feed 404 coaxially disposed with respect to the first RF feed 402. The first RF feed 402 is electrically insulated from the second RF feed 404. In some embodiments, and as illustrated, the second RF feed 404 is coaxially disposed about the first RF feed 402, for example, along central axis 401. The first and second RF feeds 402, 404 may be formed of any suitable conducting material for coupling RF power to RF coils. Exemplary conducting materials may include copper, aluminum, alloys thereof, or the like. The first and second RF feeds 402, 404 may be electrically insulated by one or more insulating materials, such as air, a fluoropolymer (such as Teflon®), polyethylene, or the like.

The first RF feed 402 and the second RF feed 404 are each coupled to different ones of the first or second RF coils 110, 112. In some embodiments, the first RF feed 402 may be coupled to the first RF coil 110. The first RF feed 402 may include one or more of a conductive wire, cable, bar, tube, or other suitable conductive element for coupling RF power. In some embodiments, the cross section of the first RF feed 402 may be substantially circular. The first RF feed 402 may include a first end 406 and a second end 407. The second end 407 may be coupled to the match network 114 (as shown) or to a power divider (as shown in FIG. 1). For example, as depicted in FIG. 4A, the match network 114 may include a power divider 430 having two outputs 432, 434. The second end 407 of the first RF feed 402 may be coupled to one of the two outputs of the match network 114 (e.g., 432).

The first end 406 of the first RF feed 402 may be coupled to the first coil 110. The first end 406 of the first RF feed 402 may be coupled to the first coil 110 directly, or via some intervening supporting structure (a base 408 is shown in FIG. 4A). The base 408 may be a circular or other shape and includes symmetrically arranged coupling points for coupling the first coil 110 thereto. For example, in FIG. 4A, two terminals 428 are shown disposed on opposite sides of the base 408 for coupling to two portions of the first RF coil via, for example, screws 429 (although any suitable coupling may be provided, such as clamps, welding, or the like).

In some embodiments, and as discussed further below in relation to FIGS. 5A-B, the first RF coil 110 (and/or the second RF coil 112) may comprise a plurality of interlineated and symmetrically arranged stacked coils (e.g., two or more). For example, the first RF coil 110 may comprise a plurality of conductors that are wound into a coil, with each conductor occupying the same cylindrical plane. Each interlineated, stacked coil may further have a leg 410 extending inwardly therefrom towards a central axis of the coil. In some embodiments, each leg extends radially inward from the coil towards the central axis of the coil. Each leg 410 may be symmetrically arranged about the base 408 and/or the first RF feed 402 with respect to each other (for example two legs 180 degrees apart, three legs 120 degrees apart, four legs 90 degrees apart, and the like). In some embodiments, each leg 410 may be a portion of a respective RF coil conductor that extends inward to make electrical contact with the first RF feed 402. In some embodiments, the first RF coil 110 may include a plurality of conductors each having a leg 410 that extends inwardly from the coil to couple to the base 408 at respective ones of the symmetrically arranged coupling points (e.g., terminals 428).

The second RF feed 404 may be a conductive tube 403 coaxially disposed about the first RF feed 402. The second RF feed 404 may further include a first end 412 proximate the first and second RF coils 110, 112 and a second end 414 opposite the first end 412. In some embodiments, the second RF coil 112 may be coupled to the second RF feed 404 at the first end 412 via a flange 416, or alternatively, directly to the second RF feed 404 (not shown). The flange 416 may be circular or other in shape and is coaxially disposed about the second RF feed 404. The flange 416 may further include symmetrically arranged coupling points to couple the second RF coil 112 thereto. For example, in FIG. 4A, two terminals 426 are shown disposed on opposite sides of the second RF feed 404 for coupling to two portions of the second RF coil 112 via, for example, screws 427 (although any suitable coupling may be provided, such as described above with respect to terminals 428).

Like the first coil 110, and also discussed further below in relation to FIGS. 5A-B, the second RF coil 112 may comprise a plurality of interlineated and symmetrically arranged stacked coils. Each stacked coil may have a leg 418 extending therefrom for coupling to the flange 416 at a respective one of the symmetrically arranged coupling points. Accordingly, each leg 418 may be symmetrically arranged about the flange 216 and/or the second RF feed 404.

The second end 414 of the second RF feed 404 may be coupled to the match network 114 (as shown) or to a power divider (as shown in FIG. 1). For example, as depicted in FIG. 4A, the match network 114 includes a power divider 430 having two outputs 432, 434. The second end 414 of the second RF feed 404 may be coupled to one of the two outputs of the match network 114 (e.g., 434). The second end 414 of the second RF feed 404 may be coupled to the match network 114 via a conductive element 420 (such as a conductive strap). In some embodiments, the first and second ends 412, 414 of the second RF feed 404 may be separated by a length 422 sufficient to limit the effects of any magnetic field asymmetry that may be caused by the conductive element 420. The required length may depend upon the RF power intended to be used in the process chamber 104, with more power supplied requiring a greater length. In some embodiments, the length 422 may be between about 2 to about 8 inches (about 5 to about 20 cm). In some embodiments, the length is such that a magnetic field formed by flowing RF current through the first and second RF feeds has substantially no effect on the symmetry of an electric field formed by flowing RF current through the first and second coils 110, 112.

In some embodiments, and as illustrated in FIG. 4B, the conductive element 420 may be replaced with a disk 424. The disk 424 may be fabricated from the same kinds of materials as the second RF feed 404 and may be the same or different material as the second RF feed 404. The disk 424 may be coupled to the second RF feed 404 proximate the second end 414 thereof. The disk 424 may be an integral part of the second RF feed 404 (as shown), or alternatively may be coupled to the second RF feed 404, by any suitable means that provides a robust electrical connection therebetween, including but not limited to bolting, welding, press fit of a lip or extension of the disk about the second RF feed 404, or the like. The disk 424 may be coaxially disposed about the second RF feed 404. The disk 424 may be coupled to the match network 114 or to a power divider in any suitable manner, such as via a conductive strap or the like. The disk 424 advantageously provides an electric shield that lessens or eliminates any magnetic field asymmetry due to the offset outputs from the match network 114 (or from the power divider). Accordingly, when a disk 424 is utilized for coupling RF power, the length 422 of the second RF feed 204 may be shorter than when the conductive element 420 is coupled directly to the second RF feed 404. In such embodiments, the length 422 may be between about 1 to about 6 inches (about 2 to about 15 cm).

Figure 5A:
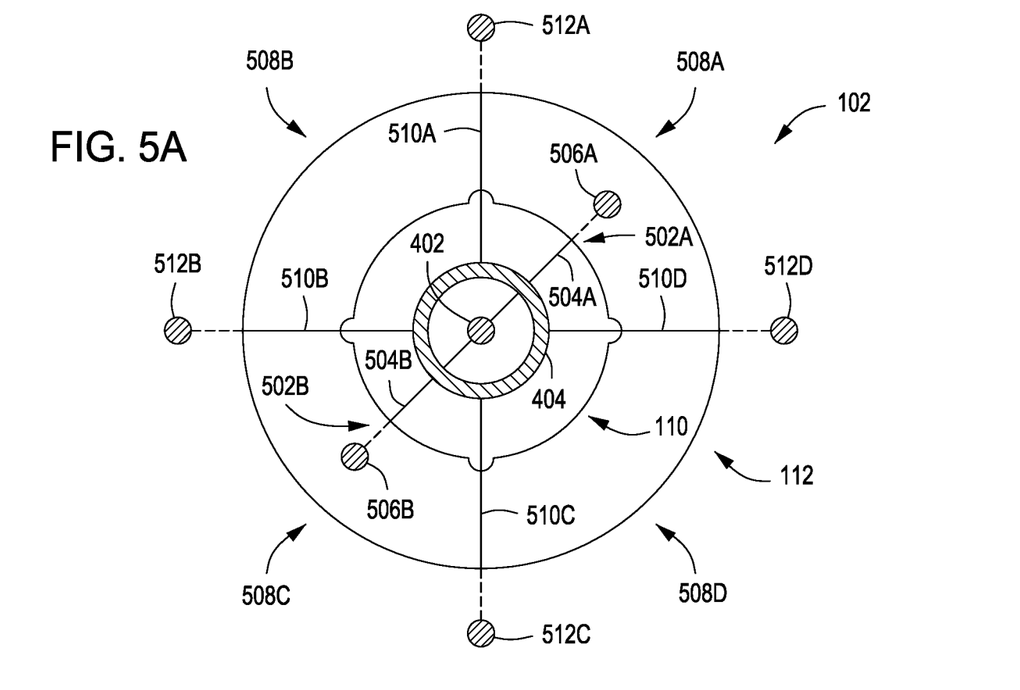
FIGS. 5A-B depict schematic top views of an inductively coupled plasma apparatus in accordance with some embodiments of the present invention.
Figure 5B:
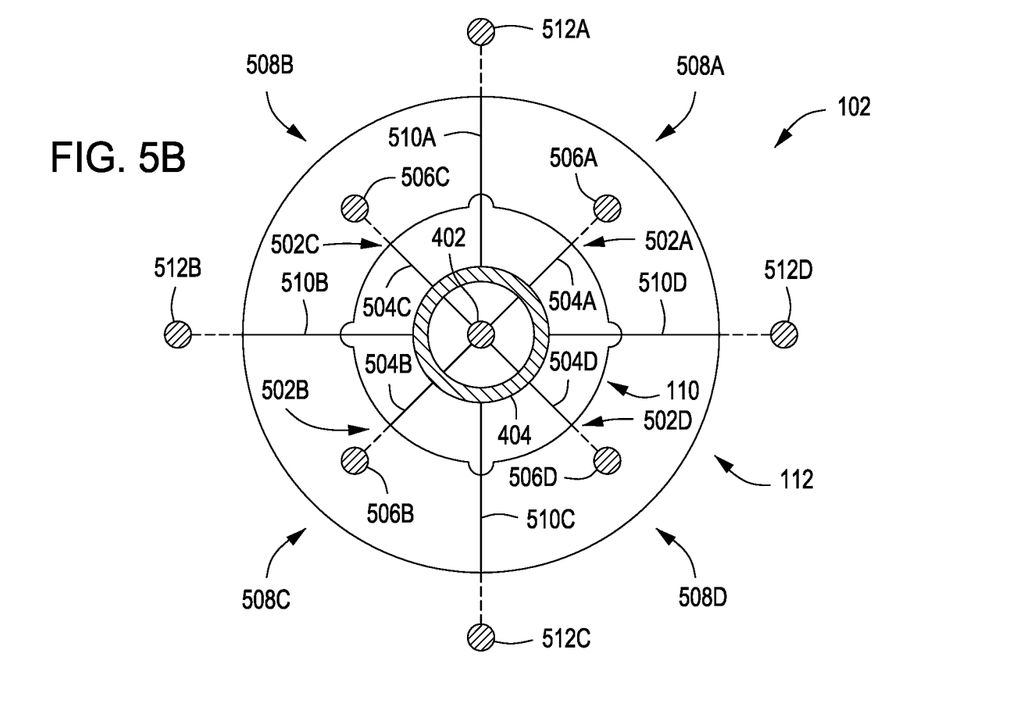

FIGS. 5A-B depict a schematic top down view of the inductively coupled plasma apparatus 102 in accordance with some embodiments of the present invention. As discussed above, the first and second coils 110, 112 need not be a singular continuous coil, and may each be a plurality (e.g., two or more) of interlineated and symmetrically arranged stacked coil elements. Further, the second RF coil 112 may be coaxially disposed with respect to the first RF coil 112. In some embodiments, the second RF coil 112 is coaxially disposed about the first RF coil 112 as shown in FIGS. 5A-B.

In some embodiments, and illustrated in FIG. 5A, the first coil 110 may include two interlineated and symmetrically arranged stacked first coil elements 502A, 502B and the second coil 112 includes four interlineated and symmetrically arranged stacked second coil elements 508A, 508B, 508C, and 508D. The first coil elements 502A, 502B may further include legs 504A, 504B extending inwardly therefrom and coupled to the first RF feed 402. The legs 504A, 504B are substantially equivalent to the legs 410 discussed above. The legs 504A, 504B are arranged symmetrically about the first RF feed 402 (e.g., they are opposing each other). Typically, RF current may flow from the first RF feed 402 through the legs 502A, 502B into the first coil elements 504A, 504B and ultimately to grounding posts 506A, 506B coupled respectively to the terminal ends of the first coil elements 502A, 502B. To preserve symmetry, for example, such as electric field symmetry in the first and second coils 110, 112, the ground posts 506A, 506B may be disposed about the first RF feed structure 402 in a substantially similar symmetrical orientation as the legs 502A, 502B. For example, and as illustrated in FIG. 5A, the grounding posts 506A, 506B are disposed in-line with the legs 502A, 502B.

Similar to the first coil elements, the second coil elements 508A, 508B, 508C, and 508D may further include legs 510A, 510B, 510C, and 510D extending therefrom and coupled to the second RF feed 204. The legs 510A, 510B, 510C, and 510D are substantially equivalent to the legs 418 discussed above. The legs 510A, 510B, 510C, and 510D are arranged symmetrically about the second RF feed 404. Typically, RF current may flow from the second RF feed 404 through the legs 510A, 510B, 510C, and 510D into the second coil elements 508A, 508B, 508C, and 508D respectively and ultimately to grounding posts 512A, 512B, 512C, and 512D coupled respectively to the terminal ends of the second coil elements 508A, 508B, 508C, and 508D. To preserve symmetry, for example, such as electric field symmetry in the first and second coils 110, 112, the ground posts 512A, 512B, 512C, and 512D may be disposed about the first RF feed structure 402 in a substantially similar symmetrical orientation as the legs 510A, 510B, 510C, and 510D. For example, and as illustrated in FIG. 5A, the grounding posts 512A, 512B, 512C, and 512D are disposed in-line with the legs 510A, 510B, 510C, and 510D, respectively.

In some embodiments, and as illustrated in FIG. 5A, the legs/grounding posts of the first coil 110 may oriented at an angle with respect to the legs/grounding posts of the second coil 112. However, this is merely exemplary and it is contemplated that any symmetrical orientation may be utilized, such as the legs/ground posts of the first coil 110 disposed in-line with the legs/grounding posts of the second coil 112.

In some embodiments, and illustrated in FIG. 5B, the first coil 110 may include four interlineated and symmetrically arranged stacked first coil elements 502A, 502B, 502C, and 502D. Like the first coil elements 502A, 502B, the additional first coil elements 502C, 502D may further include legs 504C, 504D extending therefrom and coupled to the first RF feed 402. The legs 504C, 504D are substantially equivalent to the legs 410 discussed above. The legs 504A, 504B, 504C, and 504D are arranged symmetrically about the first RF feed 402. Like the first coil elements 502A, 502B, the first coil elements 502C, 502D terminate at grounding posts 506C, 506D disposed in-line with legs 504C, 504D. To preserve symmetry, for example, such as electric field symmetry in the first and second coils 110, 112, the ground posts 506A, 506B, 506C, and 506D may be disposed about the first RF feed structure 402 in a substantially similar symmetrical orientation as the legs 502A, 502B, 502C, and 502D. For example, and as illustrated in FIG. 5B, the grounding posts 506A, 506B, 506C, and 506D are disposed in-line with the legs 502A, 502B, 502C, and 502D, respectively. The second coil elements 508A, 508B, 508C, and 508D and all components (e.g., legs/grounding posts) thereof are the same in FIG. 5B as in FIG. 5A and described above.

In some embodiments, and as illustrated in FIG. 5B, the legs/grounding posts of the first coil 110 are oriented at an angle with respect to the legs/grounding posts of the second coil 112. However, this is merely exemplary and it is contemplated that any symmetrical orientation may be utilized, such as the legs/ground posts of the first coil 110 disposed in-line with the legs/grounding posts of the second coil 112.

Although described above using examples of two or four stacked elements in each coil, it is contemplated that any number of coil elements can be utilized with either or both of the first and second coils 110, 112, such as three, six, or any suitable number and arrangement that preserves symmetry about the first and second RF feeds 402, 404. For example, three coil elements may be provided in a coil each rotated 120 degrees with respect to an adjacent coil element.

The embodiments of the first and second coils 110, 112 depicted in FIGS. 5A-B can be utilized with any of the embodiments for altering the phase between the first and second coils as described above. For example, each of the first coil elements 502 can be wound in an opposite direction to each of the second coil elements 508 such that RF current flowing through the first coil elements is out of phase with RF current flowing through the second coil elements. Alternatively, when a phase shifter is used, the first and second coil elements 502, 508 can be wound in the same direction or in an opposite direction.

Returning to FIG. 1, optionally, one or more electrodes (not shown) may be electrically coupled to one of the first or second coils 110, 112, such as the first coil 110. The one or more electrodes may be two electrodes disposed between the first coil 110 and the second coil 112 and proximate the dielectric lid 120. Each electrode may be electrically coupled to either the first coil 110 or the second coil 112, and RF power may be provided to the one or more electrodes via the RF power supply 108 via the inductive coil to which they are coupled (e.g., the first coil 110 or the second coil 112).

In some embodiments, the one or more electrodes may be movably coupled to one of the one or more inductive coils to facilitate the relative positioning of the one or more electrodes with respect to the dielectric lid 120 and/or with respect to each other. For example, one or more positioning mechanisms may be coupled to one or more of the electrodes to control the position thereof. The positioning mechanisms may be any suitable device, manual or automated, that can facilitate the positioning of the one or more electrodes as desired, such as devices including lead screws, linear bearings, stepper motors, wedges, or the like. The electrical connectors coupling the one or more electrodes to a particular inductive coil may be flexible to facilitate such relative movement. For example, in some embodiments, the electrical connector may include one or more flexible mechanisms, such as a braided wire or other conductor. A more detailed description of the electrodes and their utilization in plasma processing apparatus can be found in U.S. patent application Ser. No. 12/182,342, filed Jul. 30, 2008, titled "Field Enhanced Inductively Coupled Plasma (FE-ICP) Reactor," which is herein incorporated by reference in its entirety.

A heater element 121 may be disposed atop the dielectric lid 120 to facilitate heating the interior of the process chamber 104. The heater element 121 may be disposed between the dielectric lid 120 and the first and second coils 110, 112. In some embodiments, the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thereby facilitating uniform plasma formation within the process chamber 104.

During operation, a substrate 115 (such as a semiconductor wafer or other substrate suitable for plasma processing) may be placed on the pedestal 116 and process gases may be supplied from a gas panel 138 through entry ports 126 to form a gaseous mixture 150 within the process chamber 104. The gaseous mixture 150 may be ignited into a plasma 155 in the process chamber 104 by applying power from the plasma source 108 to the first and second coils 110, 112 and optionally, the one or more electrodes (not shown). In some embodiments, power from the bias source 122 may be also provided to the pedestal 116. The pressure within the interior of the chamber 104 may be controlled using a throttle valve 127 and a vacuum pump 136. The temperature of the chamber wall 130 may be controlled using liquid-containing conduits (not shown) that run through the wall 130.

The temperature of the wafer 115 may be controlled by stabilizing a temperature of the support pedestal 116. In one embodiment, helium gas from a gas source 148 may be provided via a gas conduit 149 to channels defined between the backside of the wafer 115 and grooves (not shown) disposed in the pedestal surface. The helium gas is used to facilitate heat transfer between the pedestal 116 and the wafer 115. During processing, the pedestal 116 may be heated by a resistive heater (not shown) within the pedestal to a steady state temperature and the helium gas may facilitate uniform heating of the wafer 115. Using such thermal control, the wafer 115 may illustratively be maintained at a temperature of between 0 and 500 degrees Celsius.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 446 are coupled to the CPU 144 for supporting the processor in a conventional manner. These circuits include cache, power supplies, clock circuits, input/output circuitry and subsystems, and the like. The inventive method may be stored in the memory 142 as software routine that may be executed or invoked to control the operation of the reactor 100 in the manner described above. The software routine may also be stored and/or executed by a second CPU (not shown) that is remotely located from the hardware being controlled by the CPU 144.

Figure 6:
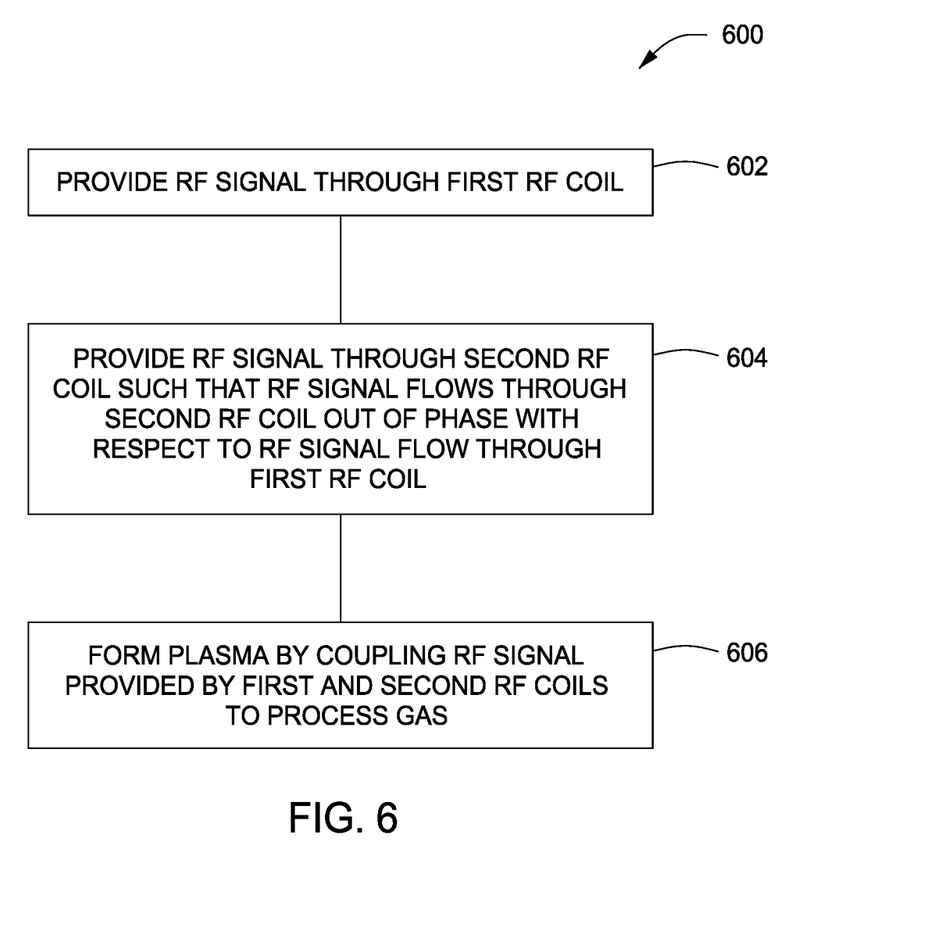
FIG. 6 depicts a flow chart for a method of forming a plasma in accordance with some embodiments of the present invention.

FIG. 6 depicts a flow chart of a method for forming a plasma in accordance with some embodiments of the present invention. The method 600 is described below in accordance with embodiments of the invention illustrated in FIGS. 1-3, however, the method 600 can be applied with any embodiments of the invention described herein.

The method 600 begins at 602 by providing an RF signal through a first RF coil, such as the first RF coil 110 (although the "first RF coil" of the method 600 may be either of the RF coils discussed above). The RF signal may be provided at any suitable frequency desired for a particular application. Exemplary frequencies include but are not limited to, a frequency of between about 100 kHz to about 60 MHz. The RF signal may be provided at any suitable power, such as up to about 5000 Watts.

At 604, the RF signal is provided through a second RF coil, e.g., the second RF coil 112, coaxially disposed with respect to the first RF coil such that the RF signal flows through the second coil out of phase with respect to the flow of the RF signal through the first coil. Any of the above embodiments may be utilized to control the phase of the RF current flowing through the first and second coils. For example, as discussed above, to create an out of phase condition between the first and second coils, the first and second coils can be wound in opposite directions, e.g., the first and second directions 202, 204 as illustrated in FIG. 2. Alternatively or in combination, a phase shifter, such as phase shifter 302, or blocking capacitors 302, 304, can be utilized to shift the phase of the RF current flowing through the first and/or second RF coils such that the RF current flowing through the first RF coil is out of phase with the RF current flowing through the second RF coil. In some embodiments, the phase shifter or blocking capacitor may shift the phase such that the RF current flowing through the first RF coil is about 180 degrees out of phase with the RF current flowing through the second RF coil. However, the RF current need not be about 180 degrees out of phase, and in some embodiments, the phase may be between about 0 to about +/−180 degrees out of phase.

At 606, a plasma, such as the plasma 155, may be formed by coupling the RF signal provided by the first and second RF coils to a process gas, such as the gaseous mixture 150, disposed in a process chamber. The process gas may include any suitable process gas for forming a plasma. In some embodiments, the RF signal may be provided at an equal power setting to each of the first and second RF coils. In some embodiments, the RF signal may be provided at a fixed or an adjustable power ratio of between about 1:0 to about 0:1 between the first and second RF coils. The plasma may be maintained for a desired period of time using the same or different settings of the RF current ratio and/or the phase difference of the RF current flowing through the first and second RF coils.

Thus, methods and apparatus for plasma processing are provided herein. The inventive methods and plasma processing apparatus advantageous reduces additive electric field properties between adjacent plasma coils in multi-coil plasma apparatus. Accordingly, a plasma formed utilizing the inventive plasma apparatus has an improved electric field distribution, and can be utilized to produce a smoother etch surface.

While the foregoing is directed to embodiments of the present invention, other and further embodiments of the invention may be devised without departing from the basic scope thereof.

The invention claimed is:

1. A plasma processing apparatus, comprising:
   a process chamber having an interior processing volume;
   a first RF coil disposed proximate the process chamber to couple RF energy into the processing volume;
   a second RF coil disposed proximate the process chamber to couple RF energy into the processing volume, wherein the first and second RF coils are configured such that RF current flowing through the first RF coil is out of phase with RF current flowing through the second RF coil; and an RF feed structure comprising:
  a first RF feed coupled to the first RF coil, and
  a second RF feed coupled to the second RF coil and coaxially disposed about the first RF feed, wherein the first RF feed is electrically insulated from the second RF feed, and wherein the second RF feed comprises a conductive tube having a first end proximate the first and second RF coils and a second end opposite the first end, wherein the first and second end of the conductive tube are separated by a length of 2-20 cm such that an electromagnetic field formed by flowing RF current through the first and second RF feeds has substantially no effect on a symmetry of an electromagnetic field formed by flowing RF current through the first and second RF coils and coupled to the plasma.

2. The plasma processing apparatus of claim 1, wherein RF current flowing through the first RF coil is about 180 degrees out of phase with RF current flowing through the RF second coil.

3. The plasma processing apparatus of claim 1, wherein the second RF coil is coaxially disposed about the first RF coil.

4. The plasma processing apparatus of claim 3, wherein the first RF coil further comprises a plurality of symmetrically arranged first coil elements and wherein the second RF coil further comprises a plurality of symmetrically arranged second coil elements.

5. The plasma processing apparatus of claim 4 wherein the number of first coil elements is two and the number of second coil elements is four.

6. The plasma processing apparatus of claim 4, wherein the number of first coil elements is four and the number of second coil elements is four.

7. The plasma processing apparatus of claim 6, wherein the first RF feed is coupled to each of the first coil elements, and wherein the second RF feed is coaxially disposed about the first RF feed and electrically insulated therefrom, the second RF feed coupled to each of the second coil elements.

8. The plasma processing apparatus of claim 7, wherein the plurality of first coil elements is symmetrically disposed about the first RF feed and the plurality of second coil elements is symmetrically disposed about the second RF feed.

9. The plasma processing apparatus of claim 7, further comprising:
  a heater element disposed between the first and second RF coils and a dielectric lid of the process chamber.

10. A plasma processing apparatus, comprising:
  a process chamber having an interior processing volume;
  a first RF coil disposed proximate the process chamber to couple RF energy into the processing volume;
  a second RF coil disposed proximate the process chamber to couple RF energy into the processing volume, the second RF coil disposed coaxially with respect to the first RF coil;
  one or more blocking capacitors coupled to at least one of the first or the second RF coil and configured to shift a phase of a RF current flowing therethrough such that RF current that flows through the first RF coil is 180 degrees out of phase with RF current that flows through the second RF coil; and
  an RF feed structure comprising:
    a first RF feed coupled to the first RF coil, and
    a second RF feed coupled to the second RF coil and coaxially disposed about the first RF feed, wherein the first RF feed is electrically insulated from the second RF feed, and wherein the second RF feed comprises a conductive tube having a first end proximate the first and second RF coils and a second end opposite the first end.

11. The plasma processing apparatus of claim 10, wherein the first RF coil and the second RF coil are wound in the same direction.

12. The plasma processing apparatus of claim 10, wherein the first RF coil is wound in a first direction and wherein the second RF coil is wound in a second direction opposite the first direction.

* * * * *